United States Patent [19]

Friedman

[11] Patent Number: 4,799,617

[45] Date of Patent: Jan. 24, 1989

[54] CONVECTION HEAT ATTACHMENT AND REMOVAL INSTRUMENT FOR SURFACE MOUNTED ASSEMBLIES

[75] Inventor: Gennady Friedman, Randallstown, Md.

[73] Assignee: Advanced Techniques Co., Inc., Huntingdon Valley, Pa.

[21] Appl. No.: 106,487

[22] Filed: Oct. 9, 1987

[51] Int. Cl.$^4$ ................................................ B23K 3/04
[52] U.S. Cl. ................... 228/180.2; 228/191; 228/222; 228/264; 228/44.7
[58] Field of Search .................... 228/180.2, 191, 222, 228/264, 242, 6.2, 9, 44.7, 45, 46

[56] References Cited

U.S. PATENT DOCUMENTS

| | | | |
|---|---|---|---|
| 3,382,564 | 5/1968 | Gallentine | 228/191 |
| 4,151,945 | 5/1979 | Ragard et al. | 228/6.2 |
| 4,295,596 | 10/1981 | Doten et al. | 228/242 |
| 4,426,571 | 1/1984 | Beck | 228/264 |
| 4,564,135 | 1/1986 | Barresi et al. | 228/6.2 |
| 4,569,473 | 2/1986 | Guiliano | 228/264 |
| 4,620,659 | 11/1986 | Holdway | 228/191 |
| 4,659,004 | 4/1987 | Fridman | 228/6.2 |

Primary Examiner—Nicholas P. Godici
Assistant Examiner—Samuel M. Heinrich

[57] ABSTRACT

A convection heat attachment and removal system for surface mounted assemblies is disclosed which uses a flow of heated gas to heat and melt solder contacts between surface mounted components and printed circuit boards. The system protects components adjacent to the workpiece by confining the flow of hot gas within a nozzle conduit which encompasses the workpiece. The system also protects the workpiece from overheating and thermal shock by shielding the workpiece from direct incidence of hot gas and by cooling the top surface of the workpiece with cool air. Relative positioning of the workpiece, the printed circuit board and the source of convection heat is accomplished by an arm mechanism as well as an X-Y table. The positioning means in this system are designed to accommodate a method of precise positioning disclosed herein. Convenient physical and visual access is provided to the workpiece and its location on the printed circuit board at any time during positioning.

15 Claims, 3 Drawing Sheets

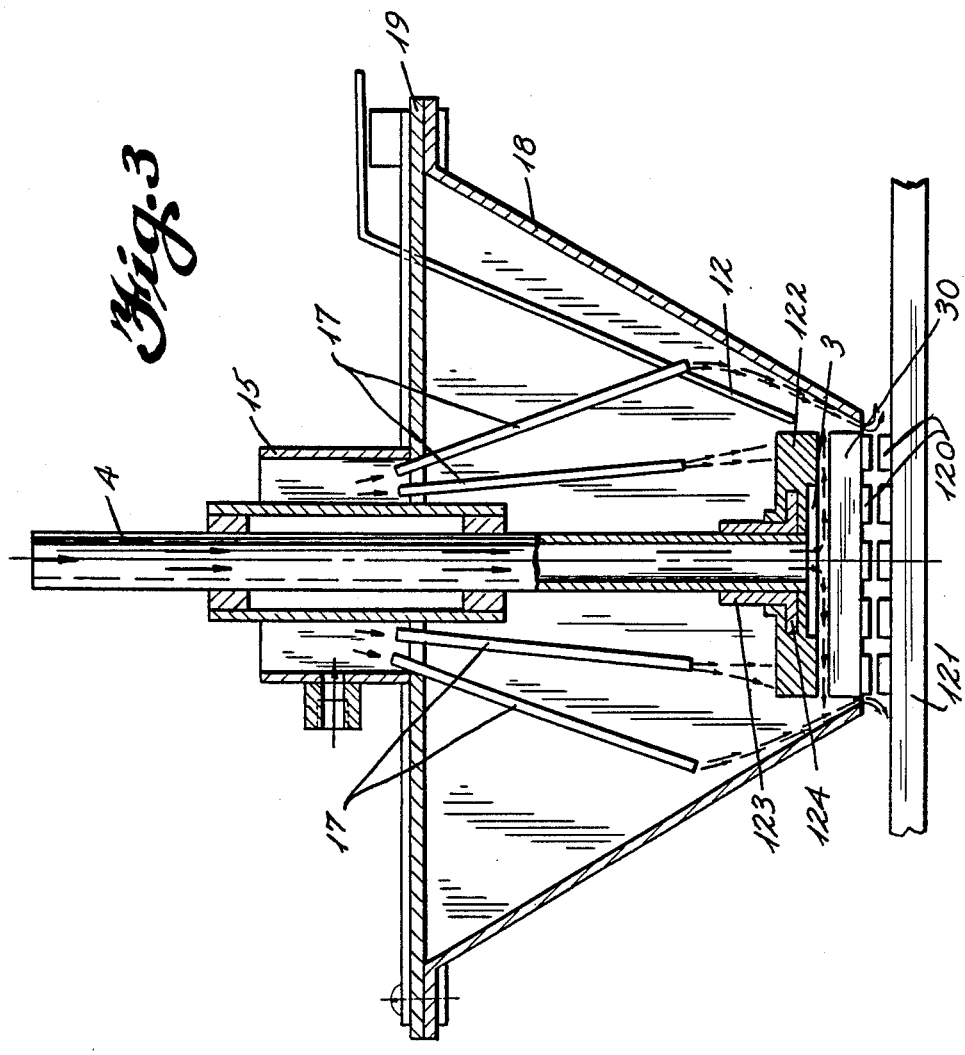

CONVECTION HEAT ATTACHMENT AND REMOVAL INSTRUMENT FOR SURFACE MOUNTED ASSEMBLIES

BACKGROUND OF THE INVENTION

1. Field of the Invention

The present invention relates generally to a method and an apparatus for soldering surface mounted electronic components to and desoldering them from metallic contacts on substrates such as printed circuit boards.

2. Summary of the Invention and Description of the Prior Art

A convection heat system for metallic solder attachment and detachment of components surface-mounted on printed circuit boards is disclosed. For soldering, the system conveniently, rapidly and precisely positions the workpiece component, the printed circuit board and a source of convection heat relatively to each other through either moving the printed circuit board using X-Y table or through moving the vacuum-held workpiece with the source of convection heat to a desired relation with the printed circuit board using an arm system that moves in X, Y and Z directions independently of the X-Y table. The source of convection heat used for melting the solder is hot gas which is forced to flow down the terminus of the arm inside a nozzle conduit that encompasses the component work area where the hot gas deflecting inwardly from the nozzle conduit walls moves rapidly past the area to be heated and then outward from the printed circuit board working area. At the same time that the hot gas flow is melting solder, cooling air is forced down a tube inside the nozzle conduit onto the top central portion of the workpiece component surface. The tube used for passage of the cooling air may advantageously be used also for the vacuum holding of the workpiece since the two operations take place at different times. A thermal sensor in the immediate vicinity of the solder joints effectively measures the temperature of the solder so that the heating process can be controlled or terminated.

Hot gas has been used in a number of existing systems to melt solder contacts between surface mounted components and printed circuit boards so as to release or secure these contacts. One such system was disclosed in the U.S. Pat. No. 4,426,571, where the main problem is that the hot air flow is not restricted to the immediate vicinity of the workpiece, and overheating of components adjacent to the workpiece occurs. Large amount of hot air required in this case often causes damage to the printed circuit board. In the present invention hot gas is restricted to the immediate vicinity of the workpiece by means of a nozzle conduit.

Another problem encountered in practical applications of the method disclosed in the U.S. Pat. No. 4,426,571 is damage of circuitry printed on the printed circuit board. This damage may easily occur when the workpiece is picked up by hand or a hand held tool while the solder contacts connecting the workpiece to the printed circuitry are not completely melted. The present invention provides vacuum pick-up so that no excessive force may be applied to lift the workpiece off the printed circuit board.

The idea of restricting hot gas to the immediate vicinity of the workpiece has been previously disclosed in the U.S. Pat. No. 4,552,300, where hot gas fills the cavity formed between the nozzle walls and the printed circuit board, and the workpiece is located in the cavity. This method proved to be inefficient in transferring heat from hot gas to solder contacts. In the present invention the heat exchnge occurs between hot gas rapidly moving directly past the solder contacts into the area outside the nozzle conduit.

Another problem that often occurs when soldering or desoldering contacts between the workpiece and the printed circuit board is overheating and/or thermal shock damage of the workpiece itself. The present invention provides means for cooling the workpiece and shielding it from direct incidence of hot gas to avoid overheating and thermal shock damage of the workpiece.

In systems such as CRAFT-100 by PACE Inc. and systems manufactured by AIRVAC little or no visual and physical access is provided to the workpiece during positioning of the workpiece on the printed circuit board. In the present invention convenient visual and physical access is provided to the workpiece at any time during positioning by allowing the nozzle conduit to move away from the workpiece during positioning and completely enclose the workpiece during soldering.

In existing systems, relative positioning of the workpiece and the printed circuit board is accomplished by moving the printed circuit board so that the area of interest is precisely underneath the component and the source of heat. Moving the printed circuit board, which is often many times larger than the component, in precise manner is often inconvenient. The present invention provides means for moving the workpiece held by vacuum at the end of an arm mechanism together with the source of heat as well as means for moving the printed circuit board to position the workpiece, the printed circuit board and the source of heat relatively to each other.

It is, thus, a principle object of the present invention to provide an apparatus for soldering and desoldering of contacts between surface mounted components and printed circuit boards that is more convenient and efficient than existing apparatuses.

It is an important object of this invention to provide an apparatus as described in which an efficient transfer of heat from hot gas to solder contacts is achieved by creating a turbulent rapid flow of hot gas directly past the solder contacts.

It is a further object of this invention to provide an apparatus as described where the printed circuit board and the components adjacent to the workpiece are protected from overheating by restricting the application of hot gas to the immediate vicinity of the workpiece.

Another important object is to provide an apparatus as described in which the workpiece itself is protected from overheating and thermal shock by providing means of cooling the workpiece and shielding it from direct incidence of hot gas during the process of soldering and desoldering.

It is a further object of this invention to provide an apparatus as described in which the hot gas is delivered to the solder contacts at high flow velocity without significant impact, eliminating splattering of the solder, by distributing uniformly the hot gas flow along and deflecting the flow from the walls of the nozzle conduit used to restrict hot gas application.

It is an important object of this invention to provide a method and an apparatus to position precisely and conveniently the surface mounted components, the printed circuit board and the hot gas flow relatively to each other.

It is yet another object to provide an apparatus as described above in which there is an easy and convenient visual and physical access to the workpiece and its location on the printed circuit board by allowing the nozzle conduit to move relatively to the vacuum-held workpiece.

BRIEF DESCRIPTION OF THE DRAWINGS

FIG. 3 is a diagram illustrating a soldering-desoldering process performed therewith.

DESCRIPTION OF THE PREFERRED EMBODIMENT

Figure 1:
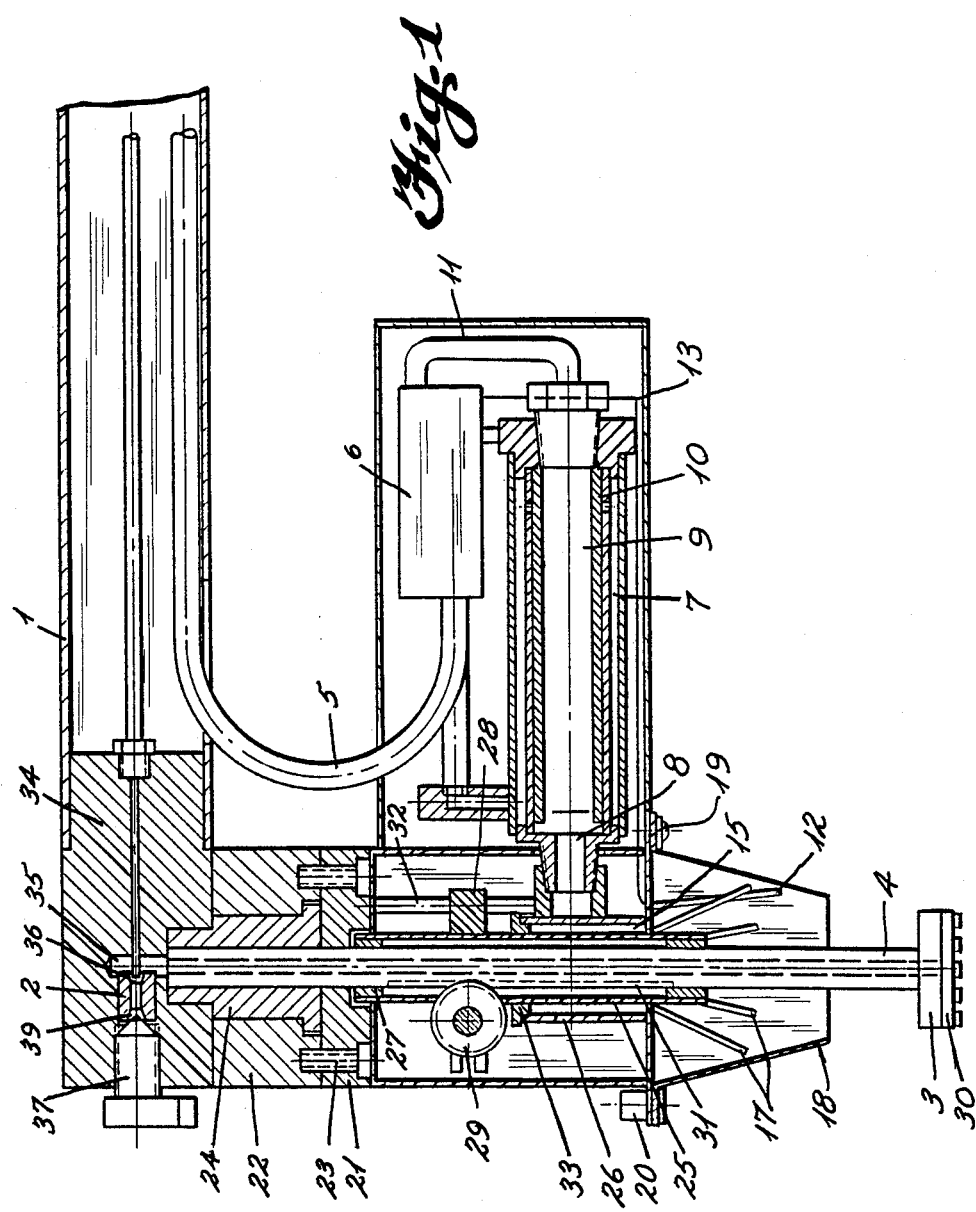
FIG. 1 is an elevational view in cross-section of the preferred embodiment of a thermal device for soldering-desoldering.

Thermal device for soldering and desoldering is shown in FIG. 1 to be downwardly dependent from the upper terminus 34 of pivoting arm 1 where venturi device 2 is connected though venturi inlet chamber 35 to the suction cup 3 by vacuum conduit 4 to provide vacuum to the suction cup 3 for holding the workpiece during positioning. This vacuum is created in the venturi inlet chamber 35 when air entering venturi inlet 36 is allowed to escape though venturi outlet 39. When venturi shutter 37 is closed, air is not allowed to escape though venturi outlet 39 and instead flows through vacuum conduit 4 to the suction cup 3 where such air flow may be used to cool the workpiece during soldering-desoldering process.

Soldering and desoldering is accomplished by hot gas which is obtained from the cool gas passed via flexible conduit 5 through connection box 6 into preheat chamber 7 of the heater assembly and thereafter into heater chamber 8 which is heated by an electric cartridge heater 9 and which is filled by stainless steel cloth 10 to facilitate heating of the gas. Flexible conduit 5 also contains metallic wires to conduct electric power through connection box 6 and via metallic wires 11 to the electric cartridge heater 9. Flexible conduit 5 also contains sensor wires which conduit electric signal from thermocouple sensor 12 through thermocouple wires 13 and through connection box 6 to electronic controls for automatic control of the temperature in the proximity of the solder contacts.

Hot gas leaving the heater chamber 8 enters manifold chamber 15 which is tightly connected to the heater chamber 8 and thereafter is forced to flow rapidly through jet needles 17 from where it moves rapidly in a multitude of jets along walls of the nozzle conduit 18 which is held to planar member 19 by means of brackets 20, toward the lower opening of the nozzle conduit 18. Vacuum conduit 4 is pressed into supporting block 21 which is held together with cover block 22 by screws 23. Bushing 24 surrounding vacuum conduit 4 is pressed into the the upper terminus 34 of the pivoting arm 1 directly underneath the venturi inlet chamber 35. When cover block 22 is rotated around its axis, vacuum conduit 4 with attached to it suction cup 3 is rotated inside bushing 24 to achieve angular alignment of the workpiece held by suction cup 3 and the printed circuit board. Manifold chamber 15 is formed between the inner tube 25 and an outer tube 26 placed so that the axis of both tubes coincide with the vacuum conduit 4 axis and the inner tube 25 extending outside the length of the outer tube 26. The inner tube 25 is permanently joined with the outer tube 26 by a ring 33 and the planar member 19 which enclose manifold chamber 15 from the top and the bottom, respectively, and the hot gas is allowed to escape the manifold chamber 15 only through jet needles 17 inserted into the planar member 19 between the inner tube 25 and the outer tube 26. The inner tube 25 has two linear bearings 27 pressed into it at opposite ends of the tube so that the bearings' axis coincide with the tube axis which facilitates the sliding motion of the inner tube 25 along the vacuum conduit 4. Gear holder 28 is permanently attached to the inner tube 25 above the outer tube 26 and holds a gear 29 which is engaged through a slot in the inner tube 25 with a rack gear 31 cut on a portion of the vacuum conduit 4 surface. When gear 29 is rotated, its axis moves up and down the vacuum conduit 4, and with it moves the gear holder 28, inner tube 25, outer tube 26 and all parts attached to them. Guiding pin 32 is pressed into the supporting block 21 and slides within the gear holder 28 during the motion of the manifold tubes 25 and 26 along the vacuum conduit 4 preventing the manifold tubes 25 and 26 and all parts attached to them from rotating around the vacuum conduit 4 axis.

Figure 2:
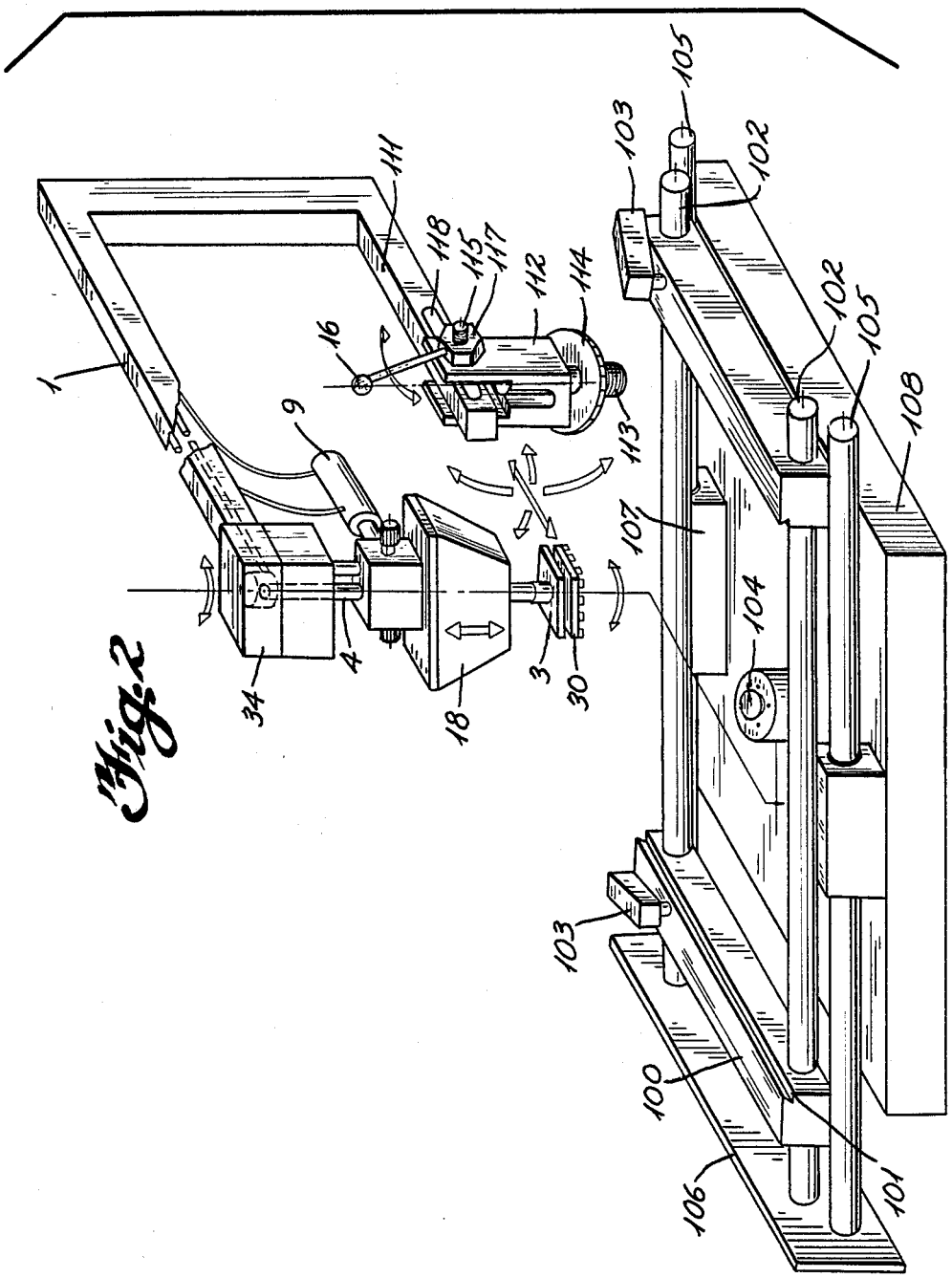
FIG. 2 is an isometric diagram of relative motions of the parts of the present invention.

Installation of the printed circuit board is explained with the help of Figure 2. The printed circuit board is held between clamps 100 with the board edges fitting into V-shaped grooves 101 cut along the width of the clamps 100 in Y-direction. The V-shaped grooves 101 are capable of accommodating boards of different thicknesses. The clamps 100 are capable of moving independently along clamp guides 102 and can be stopped in any position by rotating clamp stops 103 which, pushing against the clamp guides 102, prevent the clamps 100 from moving. Underneath the printed circuit board, fixed to the base 108, is a heater assembly 104 for heating the passing through it cool air which is then used to preheat the printed circuit board to avoid thermal shock damage to the board. The heater assembly 104 for board preheating is constructed identically to the heater assembly used for heating cool gas for soldering and desoldering. Having been installed between the clamps 100, the printed circuit board may be moved in Y-direction by sliding the board within the V-shaped grooves 101. X-direction motion of the board is accomplished by moving a frame 105 which is joined with the clamp guides 102 by a yoke 106. The frame 105 moves within Thomson bearings housed within bearing housings 107. By moving the printed circuit board in X- and Y-directions independently any area of interest on the printed circuit board may be placed over the heater assembly 104.

In FIG. 2 the thermal device described before in FIG. 1 is located underneath the upper terminus 34 of pivoting arm 1 and the workpiece 30 is shown to be held for positioning on the printed circuit board by the suction cup 3 attached to the vacuum conduit 4. The function of raising and lowering and locating in azimuth and radially the suction cup 3 to place or remove the workpiece 30 is performed by the pivoting arm 1. When the workpiece 30 is clear of the printed circuit board, the pivoting arm 1 can quickly be swung with the workpiece 30 directly to any desired location with the required degree of precision by means of pivoting mechanism to be described. In a convenient operation, simultaneously as the workpiece 30 is being located over the portion of interest on the printed circuit board, the workpiece is also rotated to a desired angular alignment by rotating the vacuum conduit 4 and lowered into soldering contact.

The pivoting arm 1 is generally a "J"-shaped tubular member and contains air conduits for air to be used by venturi device to create vacuum or air flow through the suction cup 3, gas conduits for gas to be heated and used for melting solder contacts, electric wires to provide power to heater and conduct signals from the thermocouple sensor. Lower terminus 111 is an integral terminal portion of the pivoting arm 1 which fits between the jaws of vice 112. The vice 112 is placed on a vertical stub axle 113 so that top portion of the stub axle 113 is in between the jaws of the vice 112, and the vice 112 rests on a flat surface of vertical adjustment knob 114. The stub axle 113 has a threaded portion with which the vertical adjustment knob 114 is engaged so that when the knob 114 is rotated it is raised or lowered raising or lowering the vice 112. Horizontal pivot axle 115 is pressed into one jaw of the vice 112 and goes through guideway 118 in the lower terminus 111 of the pivoting arm 1 and through a hole in the other jaw of the vice 112. Azimuthal motion of the pivoting arm 1 is accomplished through rotation of the vice 112 around the vertical stub axle 113. Radial motion of the arm 1 is accomplished through sliding motion of the lower terminus 111 of the arm 1 between the jaws of the vice 112 within the limits determined by the length of the guideway 118. Vertical motion of the arm is accomplished through rotation of the lower terminus 111 of the arm 1 around the horizontal pivot axle 115. All these motions can be prevented by rotating fixator handle 116 attached to a nut 117 which, in turn, is engaged with a threaded portion of the horizontal pivot axle 115. Turning the fixator handle 116 tightens the nut 117 clamping the jaws of the vice 112 together and preventing rotational motion of the vice as well as any motion of the pivoting arm 1.

FIG. 3 illustrates, in a diagrammatic way, the process of melting solder contacts 120 between the workpiece 30 and the printed circuit board 121 and the essential devices involved in this process. The workpiece 30 is generally a rectangular small thickness object with the top surface being flat, and solder contacts 120 are located on the sides of the workpiece around the perimeter. The nozzle conduit 18 is a conduit shaped as a truncated pyramid with a rectangular cross-section, and the bottom opening of the nozzle conduit encloses the workpiece allowing only a small clearance between the nozzle conduit walls and the corresponding sides of the workpiece.

Gas, having been previously heated, enters manifold chamber 15 and escapes through the jet needles 17 which are directed downward and at the nozzle conduit walls 18. Each jet of hot gas is then deflected by the nozzle wall 18 toward the solder contacts 120 and loses most of its impact energy spreading in width along the nozzle wall 18. The multitude of such jets create a flow of hot gas distributed along the perimeter of the nozzle conduit 18 toward the solder contacts 120. When such flow reaches the bottom opening of the nozzle conduit 18 turbulence is created because the workpiece 30 and the printed circuit board 121 constrict this opening. Such turbulence facilitates heat exchange between the solder contacts 120 and the hot gas. The hot gas, having given away its heat to the solder contacts escapes from the inside of the nozzle conduit 18 into surroundings clearing the way for the arrival of new hotter gas into the nozzle conduit 18.

The suction cup 3 is made of silicone rubber 122 formed in the shape of a rectangular object of small thickness so that when installed on top of the workpiece 30 its bottom surface could be made to cover the top surface of the workpiece in such a way that the two surfaces coincide exactly. When the suction cup 3 is positioned in this manner with respect to the workpiece it shields the workpiece from direct incidence of the hot gas during soldering or desoldering. In addition, installing the workpiece in such a way that its entire top surface is covered by the suction cup 3, centers the workpiece with respect to the vacuum conduit 4 axis so that, when the bottom opening of the nozzle conduit 18 is lowered to enclose the workpiece, equal small clearances will exist between the sides of the workpiece and the walls of the nozzle conduit 18. The suction cup 3 as well as the nozzle conduit 18 may be changed in correspondence with different sizes and rectangular shapes of the workpiece 30.

The silicone rubber 122 of the suction cup 3 is formed around the bottom part of a tubular metal member 123. The inside diameter of the tubular member 123 is such that it can be installed over the outside surface of the vacuum conduit 4 and held there by friction. Flat bottom portion 124 of the tubular member 123 is an integral part of this tubular member and lies in the plane perpendicular to the vacuum conduit axis, and the purpose of the bottom portion 124 is to support and reinforce the silicone rubber. The formed silicone rubber 122 has a hole extending through its thickness and connecting with the inside of the tubular metal member 123. Through this hole vacuum or air flow can be delivered to the top surface of the workpiece 30.

During positioning of the workpiece 30 over the corresponding board contacts, the workpiece is held by vacuum created by the venturi device and delivered to the suction cup 3 though the vacuum conduit 4. During the process of melting solder contacts, venturi device may be used to provide air flow, as discussed previously, through the vacuum conduit 4 and the suction cup 3 to the top surface of the workpiece 30. This air flows between the suction cup 3 and the top surface of the workpiece 30 and then, mixing with the hot gas, leaves the inside of the nozzle 18. Such air flow is used to cool the component during soldering-desoldering process, and does not interfere with heating of the solder contacts by hot gas since the amount of this air flow is much smaller than the amount of hot gas flow.

The thermocouple sensor 12 is lowered through a hole in the planar member 19 into the hot gas flow in the close proximity to the workpiece 30. Thermocouple signal is used to control the timing of soldering-desoldering process.

What is claimed is:
1. A method of positioning a surface mounted electronic component in a soldering position and for soldering metallic solder contacts on this component to corresponding solder contacts on a printed circuit board by means of hot gas applied to said solder contacts in a form of flow directed so as to pass by said contacts and distributed evenly along each perimeter side of said component, this method being the following sequence of operations:
attaching said component to a suction cup which has, in the plane of its bottom surface, the same rectangular shape and size as said component and is cen- trally located with respect to said flow so that said suction cup covers the whole top surface of said component;

moving said suction cup with the attached to it component until said solder contacts on the component touch the corresponding contacts on the printed circuit board on heating the solder of said solder contacts on said component and said printed circuit board to the liquid state while simultaneously cooling said component by a flow of cool air delivered through said suction cup.

2. A method of desoldering solder contacts on a surface mounted electronic component from solder contacts on a printed circuit board by means of hot gas applied to said solder contacts in a form of flow directed so as to pass by said solder contacts and distributed evenly along eachp perimeter side of said component and removing said component from said printed circuit board, this method being the following sequence of operations:

attaching a suction cup, which has, in the plane of its bottom surface, the same rectangular shape and size as said component and is centered with respect to said flow, to said component so that said suction cup covers the whole top surface of said component;

heating the solder of said solder contacts on said component and said printed circuit board to the liquid state while simultaneously cooling said component by a flow of cool air delivered through said suction cup and moving said suction cup until said solder contacts on said component do not touch said solder contacts on the printed circuit board.

3. An apparatus for positioning a surface mounted electronic component in a soldering position or for soldering solder contacts on this component to corresponding solder contacts on a printed circuit board or for desoldering such contacts and removing said electronic component, where soldering and desoldering is accomplished by heating said contacts with hot gas, said apparatus comprising:

a thermal unit for heating gas passing through it, for delivering said heated gas to said solder contacts so that said heated gas forms a thin layer of turbulent flow directed substantially downward along the inside surfaces of nozzle conduit walls, for distributing said flow around the perimeter of said component;

a component holding extension for holding said component in a fixed position with respect to said flow of hot gas, for achieving desired angular alignment of said component and said flow of hot gas with respect to said printed circuit board and for protecting said component from overheating;

moving means for moving said component holding extension and said thermal unit into any desired vertical as well as horizontal position over said printed circuit board and for holding said component holding extension and said thermal unit in that postiion;

a printed circuit board handling unit for positioning and holding said printed circuit board in a generally horizontal position and for moving said printed circuit board in horizontal plane;

printed circuit board heater means for heating said printed circuit board and means for creating vacuum or air flow to be delivered to the top surface of said electronic component interchangably to, respectively, hold said component or cool it.

4. An apparatus as in claim 3, said thermal unit comprising:

a heat exchanger means for heating compressed gas passing through it;

a nozzle conduit for delivering said flow of gas heated by said heat exchanger to said solder contacts on said component and said printed circuit board and for restricting the application of said hot gas to the immediate area of said component;

a manifold for delivering said hot gas from said heat exchanger into the inside of said nozzle conduit using a multitude of high speed gas jets directed so as to form said flow of gas inside said nozzle conduit and wherein said heat exchanger has a hot gas outlet which is rigidly connected to an inlet of said manifold, and said manifold has a manifold chamber and a bottom planar member which restricts this manifold chamber from the bottom and to which said nozzle conduit is attached by attachment means like clamps or brackets.

5. An apparatus as in claim 4 said heat exchanger having two chambers with said gas first travelling through a preheating chamber formed between an outer and an inner enclosure and then entering a heating chamber formed between said inner enclosure and an electric cartridge heater and filled with a stainless steel cloth tightly wound around said cartridge heater to facilitate heating of said gas, this hot gas leaving the heat exchanger through said outlet in said heating chamber.

6. An apparatus as in claim 4 said nozzle conduit being a conduit shaped as a truncated pyramid with a rectangular cross-section, and the area of this cross-section changing along the length of the conduit and having an outlet opening that is of generally the same rectangular shape as said component and slightly larger size to allow a small clearance between the perimeter sides of said outlet opening and the perimeter sides of said component when said component is held centered in said outlet opening in the cross-section plane of that opening.

7. An apparatus as in claim 4 said manifold chamber being formed between an inner and an outer tubular member placed coaxially around a vertical manifold axis and two planar members placed perpendicularly to said manifold axis which cover the ring shaped spaces at the top and the bottom ends of said tubular members leaving the space inside said inner tubular member uncovered, this manifold chamber having an inlet made in said outer tubular member.

8. An apparatus as in claim 4 where said bottom planar member restricting the manifold chamber from the bottom is rectangular and covers an inlet opening of said nozzle conduit which is attached to this planar member.

9. An apparatus as in claim 7 said manifold chamber having a multitude of small diameter needle-like tubes inserted through said bottom planar member into this chamber and directed generally downward away from said manifold axis, these needle-like tubes having their outlets located inside said nozzle conduit and forming a manifold outlet.

10. An apparatus as in claim 3 said component holding extension comprising:
- a suction cup for holding said component in a fixed position with respect to said flow of hot gas and for protecting said component from overheating by covering said component's top surface and shielding said component from direct incidence of said hot gas;
- a vacuum conduit for holding said suction cup, attached to it at the bottom end, equidistantly from walls of said nozzle conduit and centered in said flow of hot gas, for delivering vacuum to said suction cup to hold said component and for delivering air flow to the component's top surface through said suction cup to cool the component;
- a guiding rod the axis of which is parallel to the axis of said vacuum conduit for preventing the rotation of said thermal unit around the vacuum conduit axis relatively to said component holding extension and
- a supporting block that has an axis of rotation, said vacuum conduit pressed into said supporting block and extending through it so that said rotation axis of said supporting block coincides with said vacuum conduit axis and said guiding rod pressed into said supporting block off center and remote from said rotation axis of said supporting block, whereby said supportng block can transfer a rotational motion around its rotation axis to said component holding extension.

11. An apparatus as in claim 3 said apparatus including:
- a thermal unit including a manifold which has a central manifold axis, a manifold bottom planar member with a hole around the central manifold axis, a nozzle conduit attached to said manifold bottom planar member so that said nozzle conduit outlet opening is centered around said central manifold axis, a manifold inner tubular member the axis of which coincides with said central manifold axis, a manifold outer tubular member the axis of which coincides with said central manifold axis and an auxiliary metal member permanently attached to the outside of said manifold outer tubular member and having a hole extending through it;
- a component holding extension including a supporting block that has an axis of rotation, a vacuum conduit of circular cross-section which is pressed into said supporting block so that the vacuum conduit axis coincides with said axis of rotation of said supporting block and to the end of which a suction cup is attached and a guiding rod which is pressed into said supporting block so that the guiding rod axis is parallel to said vacuum conduit axis and does not coincide with said vacuum conduit axis;
- wherein said vacuum conduit of said component holding extension extends through said manifold inner tubular member so that the vacuum conduit axis coincides with said central manifold axis;
- wherein said guiding rod extends through said hole in said auxiliary metal member attached to said manifold outer tubular member;
- wherein said suction cup is situated centrally in said nozzle conduit outlet opening so that, when said suction cup is in the plane of this opening, equal clearance exists between the sides of said suction cup and the corresponding walls of said nozzle conduit.

12. An apparatus as in claim 11 said thermal unit being movable by means of sliding, gear means or other motion transferring means along the direction of said central manifold axis with respect to said component holding extension such motion not including rotation around said central manifold axis with respect to said component holding extension this rotation being prevented by said guiding rod extending through said manifold auxiliary metal member attached to said manifold outer tubular member and located off said central manifold axis.

13. An apparatus as in claim 3 said moving means comprising:
- an arm being a rigid tubular member having a lower terminus and an upper terminus as its integral parts and shaped so that when said upper terminus is positioned horizontally at the level of said printed circuit board outside the board area;
- a vice having two jaws and a sleeve portion centered around a vertical rotation axis, and a threaded horizontal axle that is pressed into one jaw of the vice and extends through a hole in the other jaw of the vice, this horizontal axle having a nut engaged with the thread of said horizontal axle so that, when this nut is tightened, it clamps said jaws of the vice together;
- a vertical stub axle of a round cross-section attached to the base of said apparatus with its lower end, having a threaded middle portion which is engaged with an adjustment knob and an upper portion extending through said sleeve portion of said vice, the top of said vertical stub axle being in between said vice jaws;
- wherein said lower terminus of the arm is in between said vice jaws and said threaded horizontal axle extends through a guideway cut along said lower terminus of the arm;
- wherein said sleeve portion of the vice rests on said adjustment knob so that, when this knob is rotated, it is raised or lowered, raising or lowering said vice;
- wherein said component holding extension depends directly downward from said upper terminus of the arm and
- wherein said upper terminus of the arm contains said means for creating vacuum or air flow.

14. An apparatus as in claim 13 where an azimuthal motion of said arm is accomplished through rotation of said vice around said vertical rotation axis with respect to said vertical stub axle, a radial motion of said arm is accomplished through sliding of said lower terminus of the arm between said jaws of the vice within the limits determined by the length of said guideway, a vertical motion of said arm is accomplished through rotation of said lower terminus of the arm around said threaded horizontal axle, and all motions are prevented when said jaws of the vice are clamped together by tightening said nut which is engaged with said threaded horizontal axle.

15. An apparatus as in claim 13 said means for creating vacuum or air flow being a venturi type device with an inlet chamber, an outlet and an outlet shutter, and the vacuum is being created in said inlet chamber when said outlet shutter is open and the air entering said inlet chamber in the form of a high speed stream is allowed to escape through said outlet, and the air flow is being created through said inlet chamber when said outlet shutter is closed and the air entering said inlet chamber is unable to escape through said outlet.

* * * * *